(12) United States Patent
Kim et al.

(10) Patent No.: US 11,785,771 B2
(45) Date of Patent: Oct. 10, 2023

(54) SEMICONDUCTOR MEMORY DEVICE HAVING CELL UNITS AND VIA REGIONS WITH A DIFFERENT WIDTH

(71) Applicant: SK hynix Inc., Icheon-si (KR)

(72) Inventors: Jin Ho Kim, Icheon-si (KR); Tae Sung Park, Icheon-si (KR); Sang Hyun Sung, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 303 days.

(21) Appl. No.: 17/242,232

(22) Filed: Apr. 27, 2021

(65) Prior Publication Data
US 2022/0165744 A1    May 26, 2022

(30) Foreign Application Priority Data

Nov. 26, 2020   (KR) .................. 10-2020-0160671

(51) Int. Cl.
| | | |
|---|---|---|
| *H01L 27/11565* | (2017.01) | |
| *H01L 27/11519* | (2017.01) | |
| *H01L 27/11529* | (2017.01) | |
| *H01L 27/11556* | (2017.01) | |
| *H01L 27/11582* | (2017.01) | |
| *H01L 27/11573* | (2017.01) | |
| *H10B 43/10* | (2023.01) | |
| *H10B 41/10* | (2023.01) | |
| *H10B 41/27* | (2023.01) | |
| *H10B 41/41* | (2023.01) | |
| *H10B 43/27* | (2023.01) | |
| *H10B 43/40* | (2023.01) | |

(52) U.S. Cl.
CPC ............. *H10B 43/10* (2023.02); *H10B 41/10* (2023.02); *H10B 41/27* (2023.02); *H10B 41/41* (2023.02); *H10B 43/27* (2023.02); *H10B 43/40* (2023.02)

(58) Field of Classification Search
CPC ........ H10B 43/10; H10B 41/10; H10B 41/27; H10B 41/41; H10B 43/27; H10B 43/40; H10B 43/50; H10B 43/35; G11C 16/0483; G11C 16/08; G11C 7/1057; G11C 7/106; G11C 7/1063; G11C 7/1084; G11C 7/1087; G11C 7/109; G11C 16/10; G11C 16/04; H01L 27/11575; H01L 27/1157; H01L 27/11565; H01L 27/11573; H01L 27/11582; H01L 24/08; H01L 27/11519; H01L 27/11529; H01L 27/11556
USPC .......................................................... 257/314
See application file for complete search history.

(56) References Cited

U.S. PATENT DOCUMENTS

| | | | | |
|---|---|---|---|---|
| 9,449,987 | B1 * | 9/2016 | Miyata | ............... H10B 43/10 |
| 2012/0182804 | A1 * | 7/2012 | Hung | ............... G11C 16/0483 |
| | | | | 365/185.13 |

(Continued)

FOREIGN PATENT DOCUMENTS

| | | |
|---|---|---|
| KR | 10-2019-0061376 A | 6/2019 |
| KR | 10-2020-0036202 A | 4/2020 |

*Primary Examiner* — Robert K Carpenter

(57) ABSTRACT

A semiconductor memory device includes a memory cell array disposed over a substrate extending in a first direction and a second direction intersecting with the first direction in a first semiconductor layer, and including a plurality of cell units and at least two via regions that are arranged in the second direction, wherein a width of each of the at least two via regions in the second direction is a multiple of a width of each of the plurality of cell units in the second direction.

20 Claims, 20 Drawing Sheets

(56) References Cited

U.S. PATENT DOCUMENTS

| | | | |
|---|---|---|---|
| 2019/0164991 A1* | 5/2019 | Lim .................... | H01L 23/5226 |
| 2020/0105348 A1* | 4/2020 | Kim ...................... | H10B 43/40 |
| 2021/0159149 A1* | 5/2021 | Kitazawa ............... | H10B 43/10 |
| 2021/0296337 A1* | 9/2021 | Hagishima ............. | H10B 43/27 |

* cited by examiner

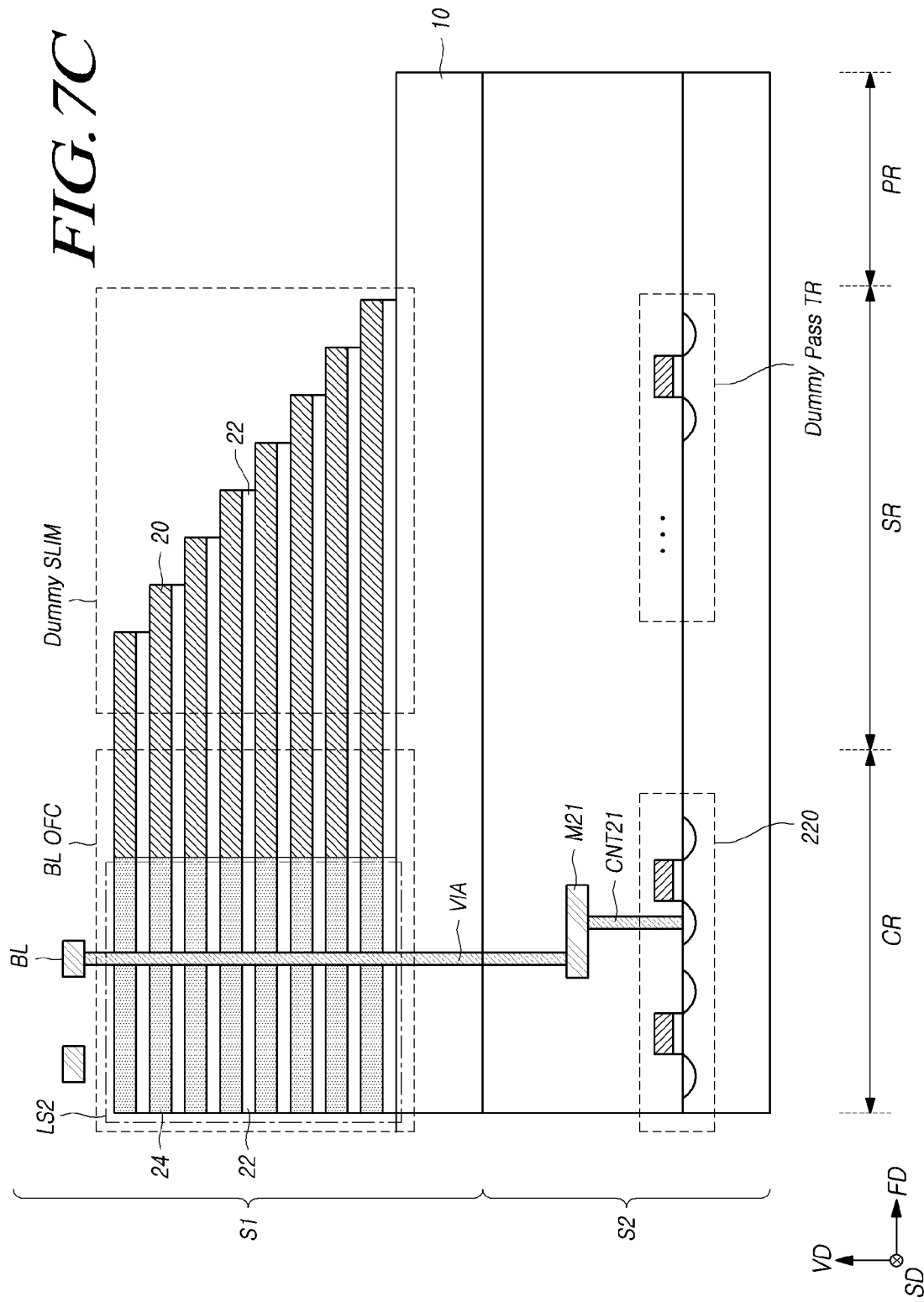

SEMICONDUCTOR MEMORY DEVICE HAVING CELL UNITS AND VIA REGIONS WITH A DIFFERENT WIDTH

CROSS-REFERENCE TO RELATED APPLICATION

The present application claims priority under 35 U.S.C. § 119(a) to Korean Patent Application No. 10-2020-0160671 filed in the Korean Intellectual Property Office on Nov. 26, 2020, which is incorporated herein by reference in its entirety.

BACKGROUND

1. Technical Field

Various embodiments generally relate to a semiconductor technology, and particularly, to a semiconductor memory device.

2. Related Art

Recently, a vertical memory device in which memory cells are vertically stacked has been developed for high integration of a semiconductor memory device. Also, a PUC (peripheral under cell) structure in which a logic circuit for controlling the memory cells is positioned below the memory cells is being studied. In the PUC structure, more memory cells may be integrated within the same area by positioning the logic circuit to vertically overlap with the memory cells.

SUMMARY

Various embodiments are directed to a semiconductor memory device with improved uniformity and reduced size.

In an embodiment, a semiconductor memory device may include: a memory cell array, disposed over a substrate extending in a first direction and a second direction intersecting with the first direction in a first semiconductor layer, that includes a plurality of cell units and at least two via regions arranged in a second direction, wherein a width of each of the at least two via regions in the second direction is a multiple of a width of each of the plurality of cell units in the second direction.

In an embodiment, a semiconductor memory device may include: a memory cell array, disposed over a substrate extending in a first direction and a second direction intersecting with the first direction in a first semiconductor layer, that includes a plurality of cell units and at least two via regions arranged in a second direction; and a plurality of block selection units, included in a second semiconductor layer arranged in a vertical direction from the first semiconductor layer, that are arranged in the second direction, wherein an interval between adjacent via regions corresponds to a multiple of a width of each of the plurality of block selection units in the second direction.

BRIEF DESCRIPTION OF THE DRAWINGS

FIG. 7C is a sectional view taken along the line III-III' of FIG. 6.

DETAILED DESCRIPTION

Figure 1:
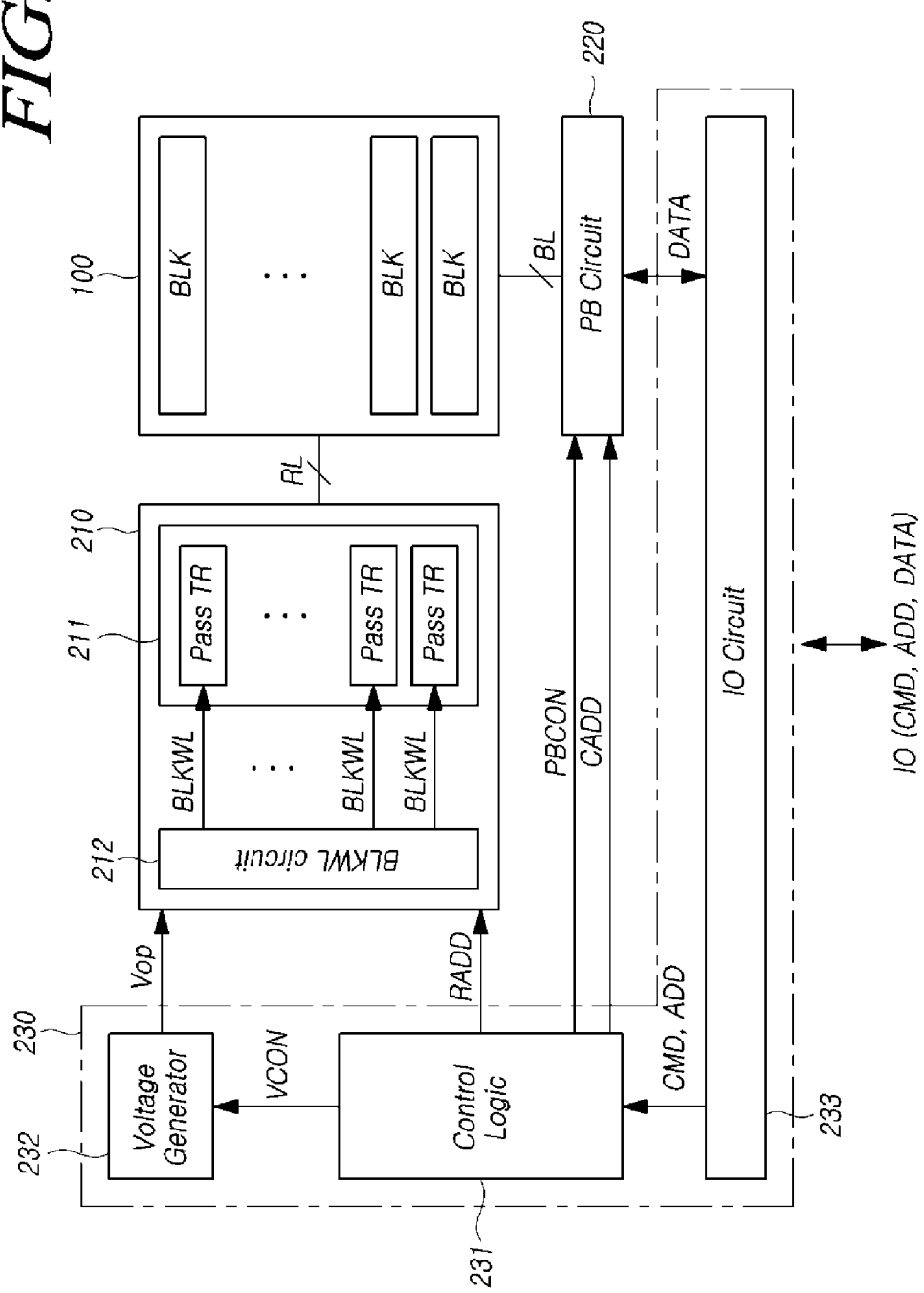
FIG. 1 is a block diagram schematically illustrating a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

In the present specification, the term 'dummy' is used to indicate a component that has a structure and a shape that are the same as or similar to those of other components but is merely present as a pattern without possessing the ability to perform substantial functions. Therefore, a 'dummy' component may not be able to perform certain electrical functions, or an electrical signal may not be applied to the 'dummy' component.

Hereinafter, various examples of embodiments of the disclosure will be described in detail with reference to the accompanying drawings.

FIG. 1 is a block diagram illustrating a semiconductor memory device in accordance with an embodiment of the disclosure.

Referring to FIG. 1, a semiconductor memory device in accordance with an embodiment of the disclosure may include a memory cell array 100, a row decoder 210, a page buffer circuit 220 and a peripheral circuit 230. The peripheral circuit 230 may include a control logic 231, a voltage generator 232 and an input/output (IO) circuit 233.

The memory cell array 100 may include a plurality of memory cells. The memory cell array 100 may be configured by a three-dimensional memory array of a type in which memory cells are stacked in a direction perpendicular to a surface of a substrate.

The memory cell array 100 may be coupled to the row decoder 210 through a plurality of row lines RL. The row lines RL may include word lines and select lines, and the select lines may include a drain select line and a source select line.

The memory cell array 100 may be coupled to the page buffer circuit 220 through bit lines BL. The memory cell array 100 may store, in a program operation, data received through the page buffer circuit 220, and may transmit, in a read operation, stored data to the page buffer circuit 220.

The memory cell array 100 may include a plurality of memory blocks BLK. A memory block BLK may be an erase unit. The row lines RL and the bit lines BL may be coupled to the memory blocks BLK. Row lines RL may be coupled to each of the memory blocks BLK, and the bit lines BL may be coupled in common to the plurality of memory blocks BLK. A description for the memory blocks BLK will be made later with reference to FIG. 2.

The row decoder 210 may include a pass transistor circuit 211 and a block decoder circuit 212.

The pass transistor circuit 211 may include a plurality of pass transistor groups Pass TR corresponding to the plurality of memory blocks BLK, respectively. Each pass transistor group Pass TR may be coupled to a corresponding memory block BLK through row lines RL.

The block decoder circuit 212 may activate one of a plurality of block select signals BLKWL in response to a row address signal RADD from the control logic 231. One of the plurality of pass transistor groups Pass TR may be selected by the activated block select signal BLKWL. The selected pass transistor group Pass TR may transfer operating voltages Vop, from the voltage generator 232, to a corresponding memory block BLK through row lines RL.

The page buffer circuit 220 may be coupled to the memory cell array 100 through the bit lines BL. The page buffer circuit 220 may receive a page buffer control signal PBCON from the control logic 231, and may transmit and receive data signals DATA to and from the TO circuit 233.

The page buffer circuit 220 may control the bit lines BL, which are coupled to the memory cell array 100, in response to the page buffer control signal PBCON. For example, the page buffer circuit 220 may detect data, stored in a memory cell of the memory cell array 100, by sensing the signal of a bit line BL of the memory cell array 100 in response to the page buffer control signal PBCON, and may transmit the data signal DATA to the TO circuit 233 according to the detected data. The page buffer circuit 220 may apply a signal to a bit line BL based on the data signal DATA, received from the TO circuit 233, in response to the page buffer control signal PBCON, and accordingly, may write data in a memory cell of the memory cell array 100. The page buffer circuit 220 may write data to or read data from a memory cell that is coupled to a word line activated by the row decoder 210.

The control logic 231 may output a voltage control signal VCON for generating voltages necessary for the operation of the semiconductor memory device, in response to a command CMD inputted through the IO circuit 233. The control logic 231 may output the page buffer control signal PBCON for controlling the page buffer circuit 220. The control logic 231 may output the row address signal RADD and a column address signal CADD in response to an address signal ADD inputted through the IO circuit 233.

The voltage generator 232 may generate the various operating voltages Vop to be used in a program, read or erase operation, in response to the voltage control signal VCON of the control logic 231. For example, the voltage generator 232 may generate program voltages, pass voltages, read voltages and erase voltages of various levels, in response to the voltage control signal VCON.

The IO circuit 233 may transfer the command CMD or the address signal ADD, inputted from outside the semiconductor memory device, to the control logic 231, or may exchange the data signals DATA with the page buffer circuit 220. The IO circuit 233 may transmit and receive data DATA to and from a device outside the semiconductor memory device, for example, a memory controller, through an input/output path IO. The input/output path IO may include $2^N$ (where N is a natural number of 2 or more) number of data input/output pins. For example, if N=3, then the input/output path IO may include eight data input/output pins, which are expressed by IO<0> to IO<7>.

Figure 2:
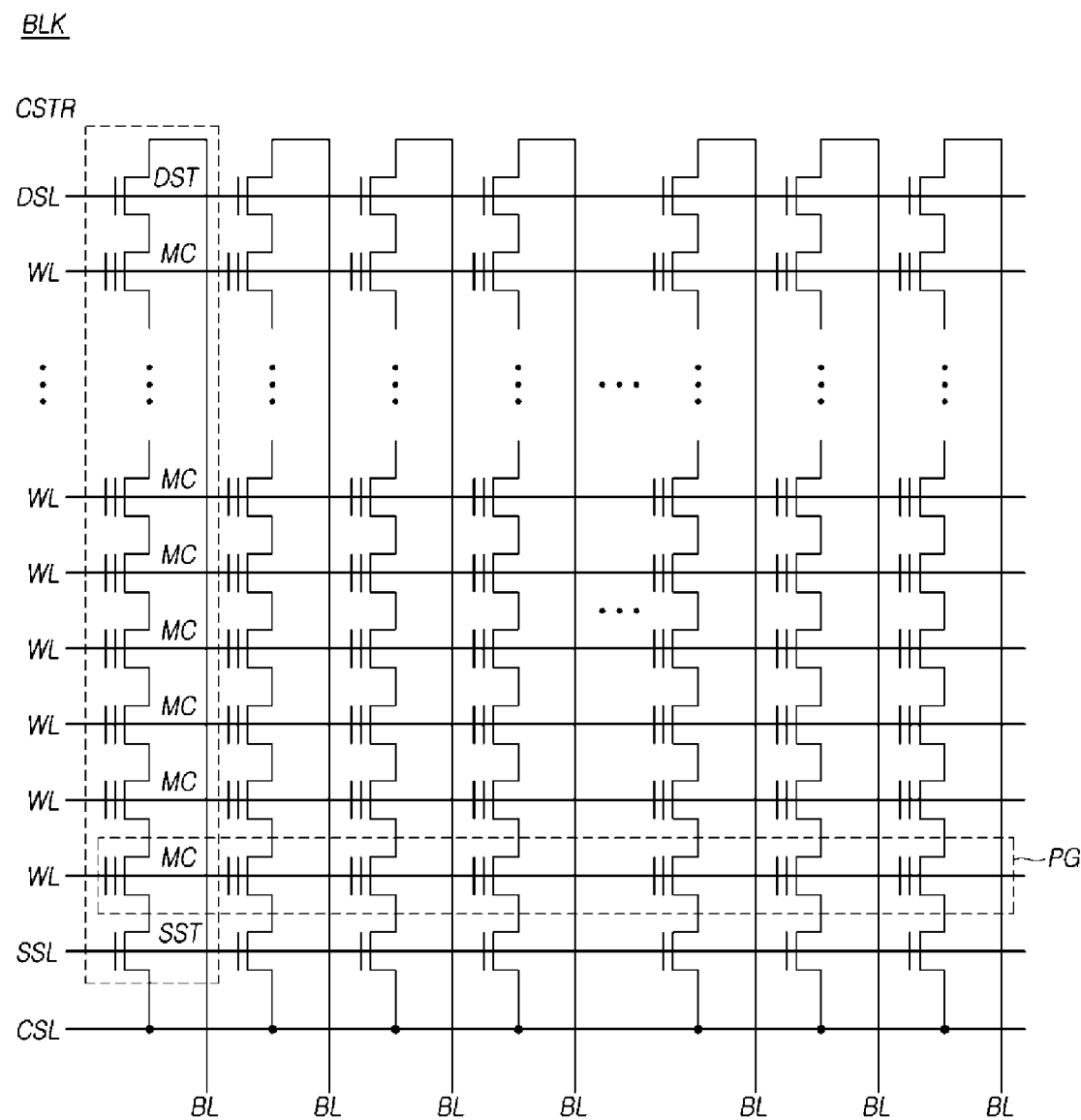
FIG. 2 is an equivalent circuit diagram of one of memory blocks illustrated in FIG. 1.

FIG. 2 is an equivalent circuit diagram of one of the memory blocks BLK illustrated in FIG. 1.

Referring to FIG. 2, a memory block BLK may include a plurality of cell strings CSTR, which are coupled between the plurality of bit lines BL and a common source line CSL.

Each of the cell strings CSTR may be coupled between a corresponding bit line BL and the common source line CSL. Each of the cell strings CSTR may include a source select transistor SST, which is coupled to the common source line CSL, a drain select transistor DST, which is coupled to the bit line BL, and a plurality of memory cells MC, which are coupled between the source select transistor SST and the drain select transistor DST. The gate of the source select transistor SST may be coupled to a source select line SSL. The gates of the memory cells MC may be coupled to word lines WL corresponding thereto, respectively. The gate of the drain select transistor DST may be coupled to a drain select line DSL.

The source select line SSL, the word lines WL and the drain select line DSL may be disposed in a direction perpendicular to the bit lines BL. The source select line SSL, the word lines WL and the drain select line DSL may form a three-dimensional structure by being stacked over the surface of a substrate in a vertical direction.

Memory cells MC included in the memory block BLK may be divided into physical page units or logical page units. For example, memory cells MC that share one word line WL and are coupled to different cell strings CSTR may configure one physical page PG. Such a page may be the basic unit of a read operation.

For instance, FIG. 2 illustrates that one drain select transistor DST and one source select transistor SST are provided in each of the cell strings CSTR. However, it is to be noted that at least two drain select transistors or at least two source select transistors may be provided in each of the cell strings CSTR.

Figure 3:
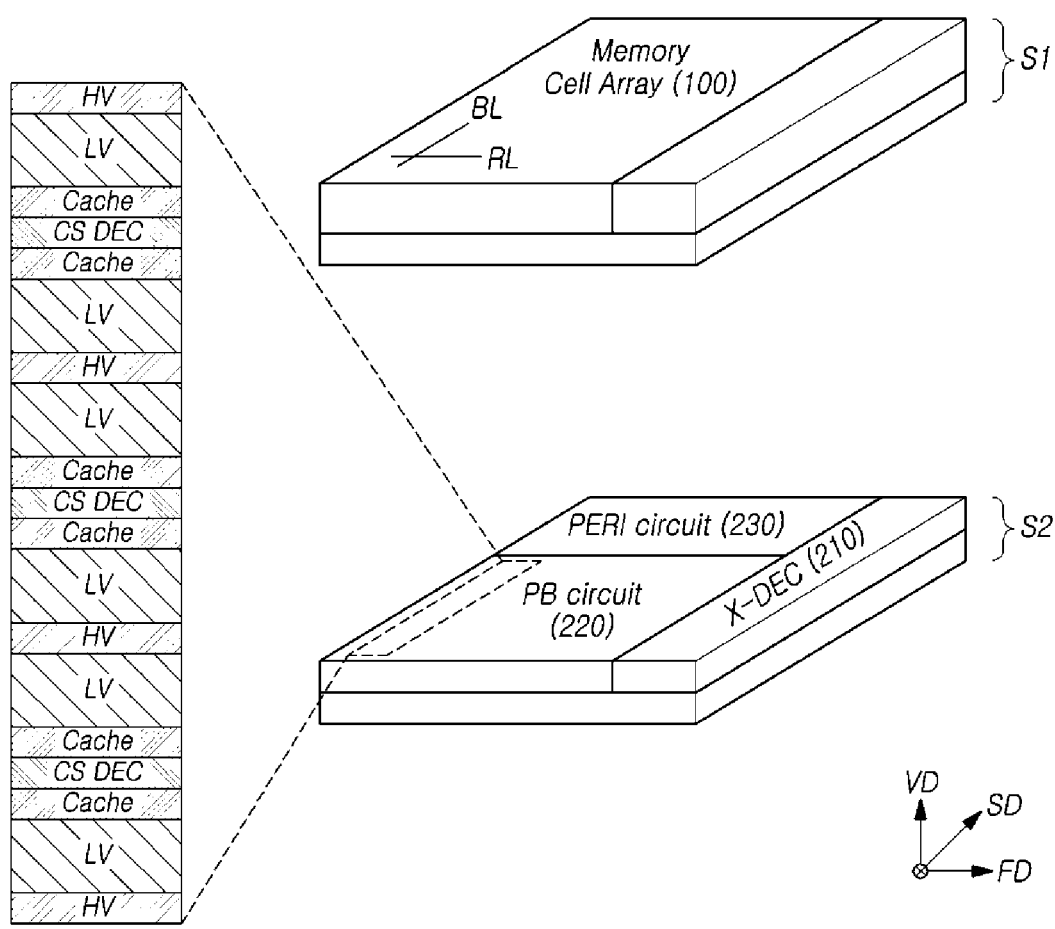
FIG. 3 is a diagram schematically illustrating a semiconductor memory device in accordance with an embodiment of the disclosure.

FIG. 3 is a diagram schematically illustrating a semiconductor memory device in accordance with an embodiment of the disclosure.

Referring to FIG. 3, a semiconductor memory device in accordance with an embodiment of the disclosure may include a first semiconductor layer S1 and a second semiconductor layer S2. The first semiconductor layer S1 may be stacked on the second semiconductor layer S2 in a vertical direction VD. In order to facilitate understanding, FIG. 3 illustrates that the first semiconductor layer S1 and the second semiconductor layer S2 are separated from each other, but it should be understood that the top surface of the second semiconductor layer S2 and the bottom surface of the first semiconductor layer S1 are actually in contact with each other.

A memory cell array 100 may be included in the first semiconductor layer S1, and a row decoder 210, a page buffer circuit 220 and a peripheral circuit 230 may be included in the second semiconductor layer S2. The semiconductor memory device in accordance with the present embodiment may have a PUC (peripheral under cell) structure.

A plurality of row lines RL and a plurality of bit lines BL may be arrayed in the memory cell array 100. The plurality of row lines RL may extend in a first direction FD, and may be arranged in a second direction SD intersecting with the first direction FD. The plurality of bit lines BL may extend in the second direction SD, and may be arranged in the first direction FD. For instance, the first direction FD and the second direction SD may perpendicularly intersect with each other.

In order to reduce the delay of a signal provided from the row decoder 210 to the row lines RL, the row decoder 210 may be disposed to have a shape extending in the second direction SD as a direction in which the row lines RL are arranged, and may be configured to have a length substantially the same as or similar to that of the memory cell array 100 in the second direction SD.

In order to reduce the delay of a signal applied to the bit lines BL from the page buffer circuit 220 or a signal received in the page buffer circuit 220 from the bit lines BL, the page buffer circuit 220 may be configured to have a length substantially the same as or similar to that of the memory cell array 100 in the first direction FD as a direction in which the bit lines BL are arranged.

The page buffer circuit 220 may include a plurality of page buffer high-voltage regions HV, a plurality of page buffer low-voltage regions LV, a plurality of cache latch regions Cache and a plurality of column decoder regions CS DEC.

The plurality of page buffer high-voltage regions HV may be disposed to be spaced apart from each other at intervals in the second direction SD, and one column decoder region CS DEC may be disposed at a middle portion between two page buffer high-voltage regions HV that are adjacent to each other in the second direction SD. One page buffer low-voltage region LV and one cache latch region Cache may be disposed between the page buffer high-voltage region HV and the column decoder region CS DEC, which are adjacent to each other. The page buffer low-voltage region LV may be disposed to be adjacent to the page buffer high-voltage region HV, and the cache latch region Cache may be disposed to be adjacent to the column decoder region CS DEC.

The page buffer circuit 220 may include a plurality of page buffer high-voltage units that are coupled to the memory cell array 100 through the bit lines BL. The plurality of page buffer high-voltage units may be divided into groups whose number is the same as the number of the page buffer high-voltage regions HV, and each group of page buffer high-voltage units may be disposed in one corresponding page buffer high-voltage region HV.

The page buffer circuit 220 may include a plurality of page buffer low-voltage units. The plurality of page buffer low-voltage units may be divided into groups whose number is the same as the number of the page buffer low-voltage regions LV, and each group of page buffer low-voltage units may be disposed in one corresponding page buffer low-voltage region LV. Each page buffer low-voltage unit may be coupled to a page buffer high-voltage unit of an adjacent page buffer high-voltage region HV through a coupling line.

The page buffer low-voltage unit may apply a voltage to a coupling line based on data stored therein. The voltage applied to the coupling line may be transferred to a bit line BL through a page buffer high-voltage unit. The page buffer low-voltage unit may perform latching based on a voltage of the coupling line. The page buffer low-voltage unit may perform latching based on a voltage transferred to the coupling line through the page buffer high-voltage unit from the bit line BL.

The page buffer circuit 220 may include a plurality of cache latches. The plurality of cache latches may be divided into groups whose number is the same as the number of the cache latch regions Cache, and each group of cache latches may be disposed in one corresponding cache latch region Cache. Each cache latch may be coupled to a page buffer low-voltage unit of an adjacent page buffer low-voltage region LV through a page line.

The cache latch may exchange data with an TO circuit, included in the peripheral circuit 230, through a data line.

The cache latch may store data received from the page buffer low-voltage unit through the page line, and may transfer the stored data to the TO circuit through the data line in response to a column decoder signal. The cache latch may exchange data with the page buffer low-voltage circuit or the TO circuit in response to a page buffer control signal received from the peripheral circuit 230.

The page buffer circuit 220 may include a plurality of column decoders. The plurality of column decoders may be divided into groups whose number is the same as the number of the column decoder regions CS DEC, and each group of column decoders may be disposed in one corresponding column decoder region CS DEC. The column decoder may be coupled to cache latches of an adjacent cache latch region Cache through a column line.

The column decoders may generate a column select signal in response to a column address provided from the peripheral circuit 230. In the case where eight data input/output pins are used, eight cache latches may be selected from among the plurality of cache latches included in the page buffer circuit 220 in response to the column select signal, and data stored in the selected eight cache latches may be transmitted to the IO circuit through the data line.

According to such a layout structure, each coupling line may be configured to have a short length coupling a page buffer high-voltage region HV and a page buffer low-voltage region LV, which are adjacent to each other; each page line may be configured to have a short length coupling a page buffer low-voltage region LV and a cache latch region Cache, which are adjacent to each other; and each column line may be configured to have a short length coupling a cache latch region Cache and a column decoder region CS DEC, which are adjacent to each other. Accordingly, the number of lines wired between a page buffer high-voltage region HV and a page buffer low-voltage region LV that are adjacent to each other, the number of lines wired between a page buffer low-voltage region LV and a cache latch region Cache that are adjacent to each other and the number of lines wired between a cache latch region Cache and a column decoder region CS DEC that are adjacent to each other may be reduced. Thus, the utilization efficiency of the wiring layer may be enhanced by disposing a large number of lines in one wiring layer.

Although the present embodiment illustrates that the number of page buffer high-voltage regions HV is four, the number of page buffer high-voltage regions HV is not limited thereto. Embodiments of the disclosure may include all cases in which the number of page buffer high-voltage regions HV is two or more.

Figure 4:
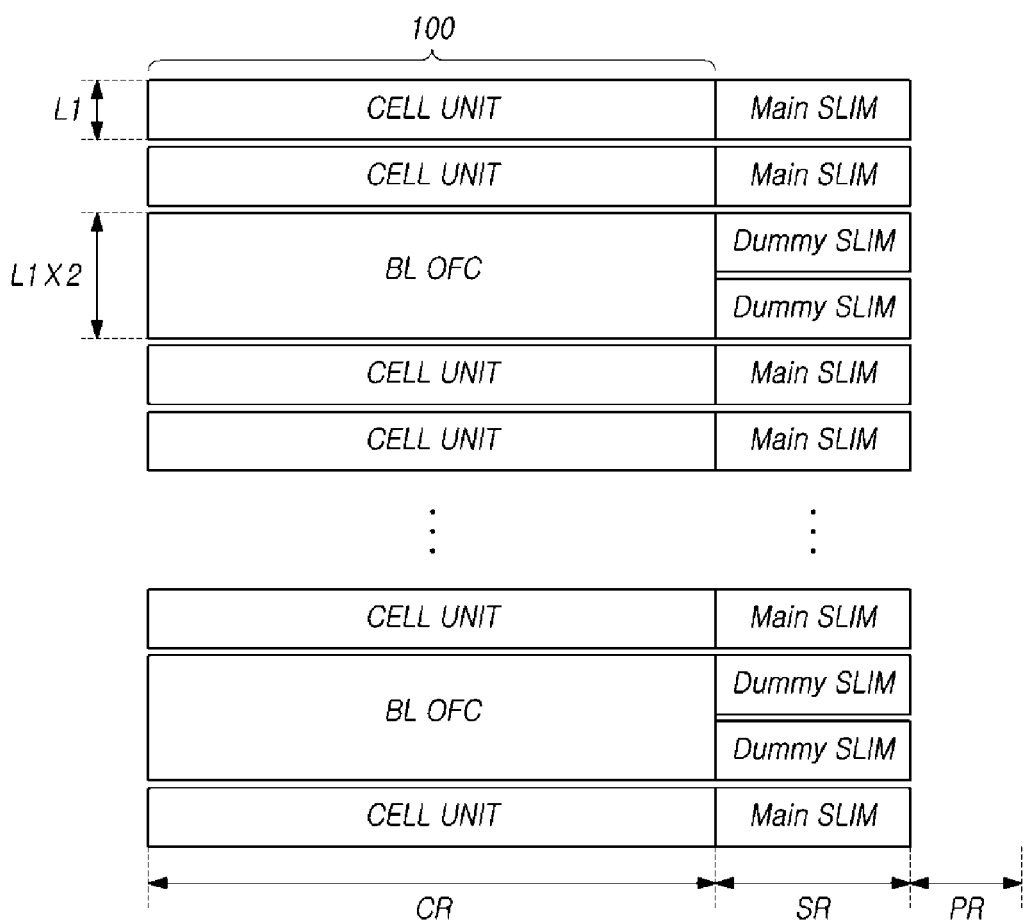
FIG. 4 is a top view illustrating a part of a first semiconductor layer illustrated in FIG. 3.
Figure 5:
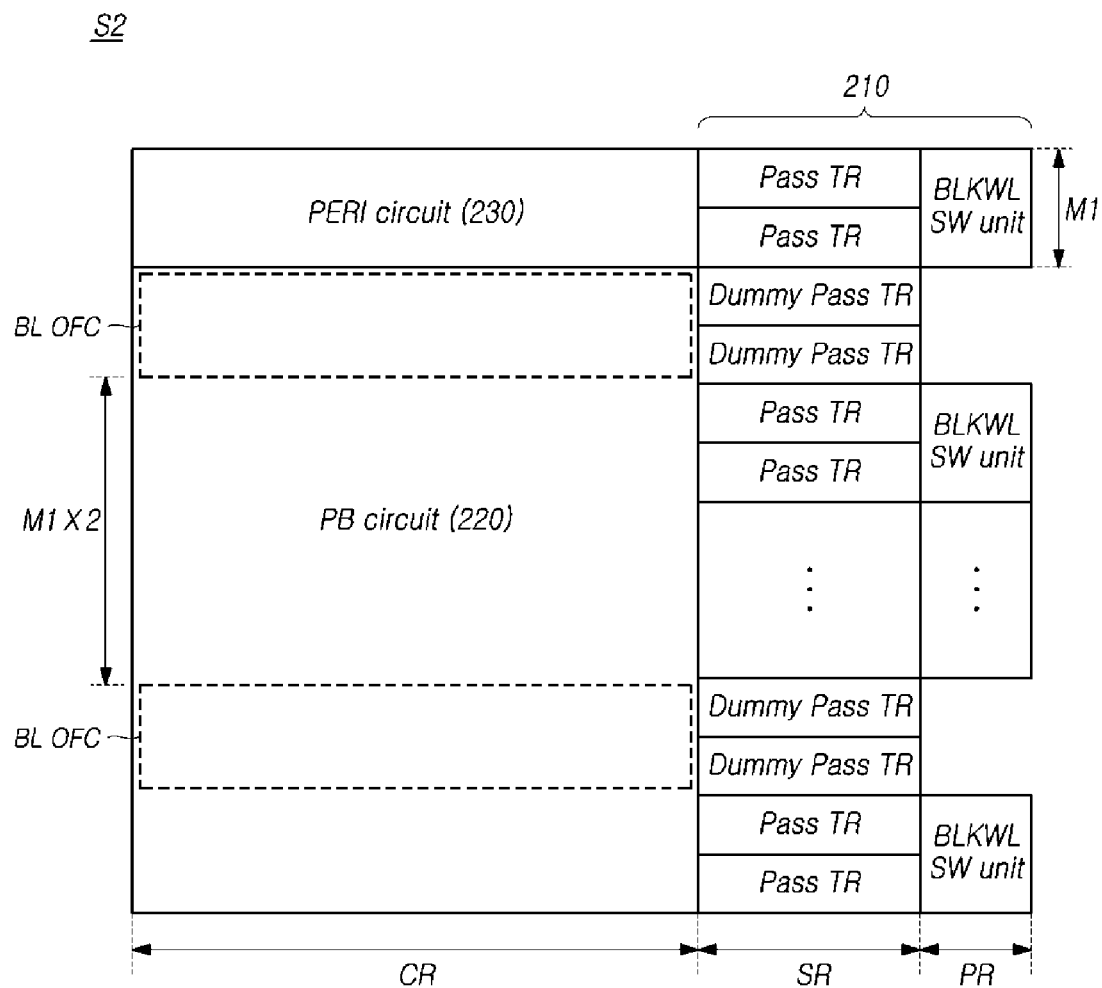
FIG. 5 is a top view illustrating a second semiconductor layer that overlaps with the first semiconductor layer of FIG. 4.

FIG. 4 is a top view illustrating a part of a first semiconductor layer illustrated in FIG. 3, and FIG. 5 is a top view illustrating a second semiconductor layer that overlaps with the first semiconductor layer of FIG. 4.

Referring to FIGS. 4 and 5, a first semiconductor layer S1 of a semiconductor memory device in accordance with an embodiment of the disclosure may include a memory cell array 100 including a plurality of cell units CELL UNIT and at least two via regions BL OFC, which are disposed in the second direction SD. A width of each via region BL OFC in the second direction SD may have a size corresponding to a multiple of a width L1 of each cell unit CELL UNIT in the second direction SD.

A second semiconductor layer S2 may include a plurality of block selection units BLKWL SW, which are disposed in the second direction SD. An interval between adjacent via regions BL OFC may have a size corresponding to a multiple of a width M1 of each block selection unit BLKWL SW in the second direction SD.

In more detail, the first semiconductor layer 51 and the second semiconductor layer S2 may each include a cell region CR, a slimming region SR that extends from the cell region CR in the first direction FD, and a peripheral region PR that extends from the slimming region SR in the first direction FD.

The memory cell array 100 may be disposed in the cell region CR of the first semiconductor layer S1, and may include the plurality of cell units CELL UNIT and the plurality of via regions BL OFC.

The plurality of cell units CELL UNIT may be arranged in a line in the second direction SD, and may each include a plurality of memory cells. One or at least two cell units CELL UNIT may configure one memory block (BLK of FIG. 1). That is to say, each memory block may be configured by one or at least two cell units CELL UNIT. FIGS. 4 and 5 illustrate one memory block configured by one cell unit CELL UNIT.

Although not illustrated, in the case where one memory block is configured by at least two cell units CELL UNIT, cell units CELL UNIT included in one memory block may be successively disposed while being adjacent to each other in the second direction SD.

The via regions BL OFC are regions where vias, which couple bit lines arranged on the memory cell array 100 and the page buffer circuit 220 of the second semiconductor layer S2, are disposed. Each via region BL OFC may be disposed between adjacent two cell units CELL UNIT.

As described above, a width of one via region BL OFC in the second direction SD may have a size corresponding to a multiple of a width of one cell unit CELL UNIT in the second direction SD. For example, if the width of one cell unit CELL UNIT in the second direction SD is L1, then the width of one via region BL OFC in the second direction SD may have a size corresponding to a multiple of L1. FIG. 4 illustrates a width of the via region BL OFC in the second direction SD as twice L1, which is the width of one cell unit CELL UNIT in the second direction SD.

The first semiconductor layer S1 may include, disposed in the slimming region SR, a plurality of main slim patterns Main SLIM and a plurality of dummy slim patterns Dummy SLIM.

The plurality of main slim patterns Main SLIM may correspond to the plurality of cell units CELL UNIT, respectively, may each be coupled to a corresponding cell unit CELL UNIT, and may each extend from the corresponding cell unit CELL UNIT in the first direction FD. A width of each main slim pattern Main SLIM in the second direction SD may be substantially the same as the width of each cell unit CELL UNIT in the second direction SD.

As will be described later with reference to FIGS. 6 to 7B, the cell unit CELL UNIT may include a plurality of electrode layers and a plurality of interlayer dielectric layers. The plurality of electrode layers and the plurality of interlayer dielectric layers may extend in the first direction FD into the slimming region SR to configure the main slim pattern Main SLIM.

The dummy slim patterns Dummy SLIM may be provided to secure pattern uniformity in the manufacturing process of the main slim patterns Main SLIM, may be coupled to the via regions BL OFC, and may be arranged in a line together with the main slim patterns Main SLIM in the second direction SD.

A width of each dummy slim pattern Dummy SLIM in the second direction SD may have substantially the same size as the width of each cell unit CELL UNIT in the second direction SD. As described above, the width of the via region BL OFC in the second direction SD has a size corresponding to a multiple of the width of the cell unit CELL UNIT in the second direction SD. Therefore, all dummy slim patterns Dummy SLIM that are coupled to the via region BL OFC may be configured such that the width of each dummy slim pattern Dummy SLIM in the second direction SD has the same size as the width of the cell unit CELL UNIT in the second direction SD.

The width of the main slim pattern Main SLIM in the second direction SD is substantially the same as the width of the cell unit CELL UNIT in the second direction SD. Thus, the fact that the width of the dummy slim pattern Dummy SLIM in the second direction SD is the same as the width of the cell unit CELL UNIT in the second direction SD may mean that the width of the dummy slim pattern Dummy SLIM in the second direction SD is the same as the width of the main slim pattern Main SLIM in the second direction SD.

FIG. 4 illustrates a width of one via region BL OFC in the second direction SD as twice the width of one cell unit CELL UNIT in the second direction SD. In this case, two dummy slim patterns Dummy SLIM are coupled to one via region BL OFC. When the width of one via region BL OFC in the second direction SD is K (where K is a natural number) times the width of one cell unit CELL UNIT in the second direction SD, a K number of dummy slim patterns Dummy SLIM may be coupled to one via region BL OFC.

Referring to FIG. 5, the row decoder 210 may include a plurality of pass transistor groups Pass TR and a plurality of dummy pass transistor groups Dummy Pass TR, which are arranged in a line in the second direction SD in the slimming region SR of the second semiconductor layer S2, and the plurality of block selection units BLKWL SW, which are arranged in a line in the second direction SD in the peripheral region PR of the second semiconductor layer S2.

The plurality of pass transistor groups Pass TR may be disposed to overlap with the main slim patterns Main SLIM of the first semiconductor layer S1 in the vertical direction VD, and the plurality of dummy pass transistor groups Dummy Pass TR may be disposed to overlap with the dummy slim patterns Dummy SLIM of the first semiconductor layer S1 in the vertical direction VD.

A width of one pass transistor group Pass TR in the second direction SD may be substantially the same as a width of one memory block in the second direction SD. As described above, one memory block may be configured by one or at least two cell units CELL UNIT and the width of one memory block in second direction SD has a size corresponding to a multiple of the width of one cell unit CELL UNIT in the second direction SD. Therefore, it may be understood that the width of one pass transistor group Pass TR in the second direction SD has a size corresponding to a multiple of the width of one cell unit CELL UNIT in the second direction SD. The present embodiment illustrates a case where one memory block is configured by one cell unit CELL UNIT. In this case, the width of one pass transistor group Pass TR in the second direction SD may be substantially the same as the width of one cell unit CELL UNIT in the second direction SD.

The pass transistor group Pass TR may include a plurality of pass transistors. Pass transistors included in the pass transistor groups Pass TR may be electrically coupled to the electrode layers of the main slim patterns Main SLIM through contacts and wiring lines to be described later with reference to FIG. 7B, and thereby, may transfer operating voltages to the electrode layers.

The dummy pass transistor groups Dummy Pass TR may be provided to secure pattern uniformity in the process of manufacturing the pass transistor groups Pass TR. The width of one dummy pass transistor group Dummy Pass TR in the second direction SD may have substantially the same size as the width of one pass transistor group Pass TR in the second direction SD.

Each of the dummy pass transistor groups Dummy Pass TR may include a plurality of dummy pass transistors. The dummy pass transistors included in each dummy pass transistor group Dummy Pass TR may have substantially the same arrangement and size as the pass transistors included in each pass transistor group Pass TR.

Unlike the pass transistors that transfer operating voltages to the electrode layers, the dummy pass transistors do not serve to transfer operating voltages to the electrode layers. The dummy pass transistors may be used as a circuit that does not electrically perform any function or performs a function other than the function of transferring operating voltages to the electrode layers.

The block selection unit BLKWL SW may correspond to a basic unit configuring a block decoder circuit 212 of FIG. 1. Although the present embodiment illustrates a width M1 of one block selection unit BLKWL SW in the second direction SD as twice the width of the pass transistor group Pass TR in the second direction SD, the disclosure is not limited thereto. As will be described later with reference to FIGS. 10A and 10B, the width of one block selection unit BLKWL SW in the second direction SD may have a size corresponding to a multiple of the width of one pass transistor group Pass TR in the second direction SD.

The page buffer circuit 220 and the peripheral circuit 230 may be disposed in the cell region CR of the second semiconductor layer S2. The via regions BL OFC may be provided in the same number as the number of the page buffer high-voltage regions HV described above with reference to FIG. 3. Although not illustrated, the via regions BL OFC may correspond to the page buffer high-voltage regions HV, respectively, and the via region BL OFC and the page buffer high-voltage region HV corresponding to each other may overlap with each other in the vertical direction VD.

As will be described later with reference to FIGS. 6 and 7C, vias disposed in the via region BL OFC may be coupled to the page buffer high-voltage region HV through electrical coupling paths (not illustrated). As the via region BL OFC and the page buffer high-voltage region HV are disposed to overlap with each other in the vertical direction VD, an electrical coupling path that couples a via disposed in the via region BL OFC and a page buffer high-voltage region HV may be configured to have a length that is the same as a shortest distance between the via and the page buffer high-voltage region HV.

As described above, an interval between adjacent via regions BL OFC may be configured to have a size corresponding to a multiple of the width of one block selection unit BLKWL SW in the second direction SD. For example, when the width of one block selection unit BLKWL SW in the second direction SD is M1, the interval between adjacent via regions BL OFC may be a multiple of M1. FIG. 5 illustrates a case where the interval between adjacent via regions BL OFC is n times M1, where n is a nature number.

Figure 6:
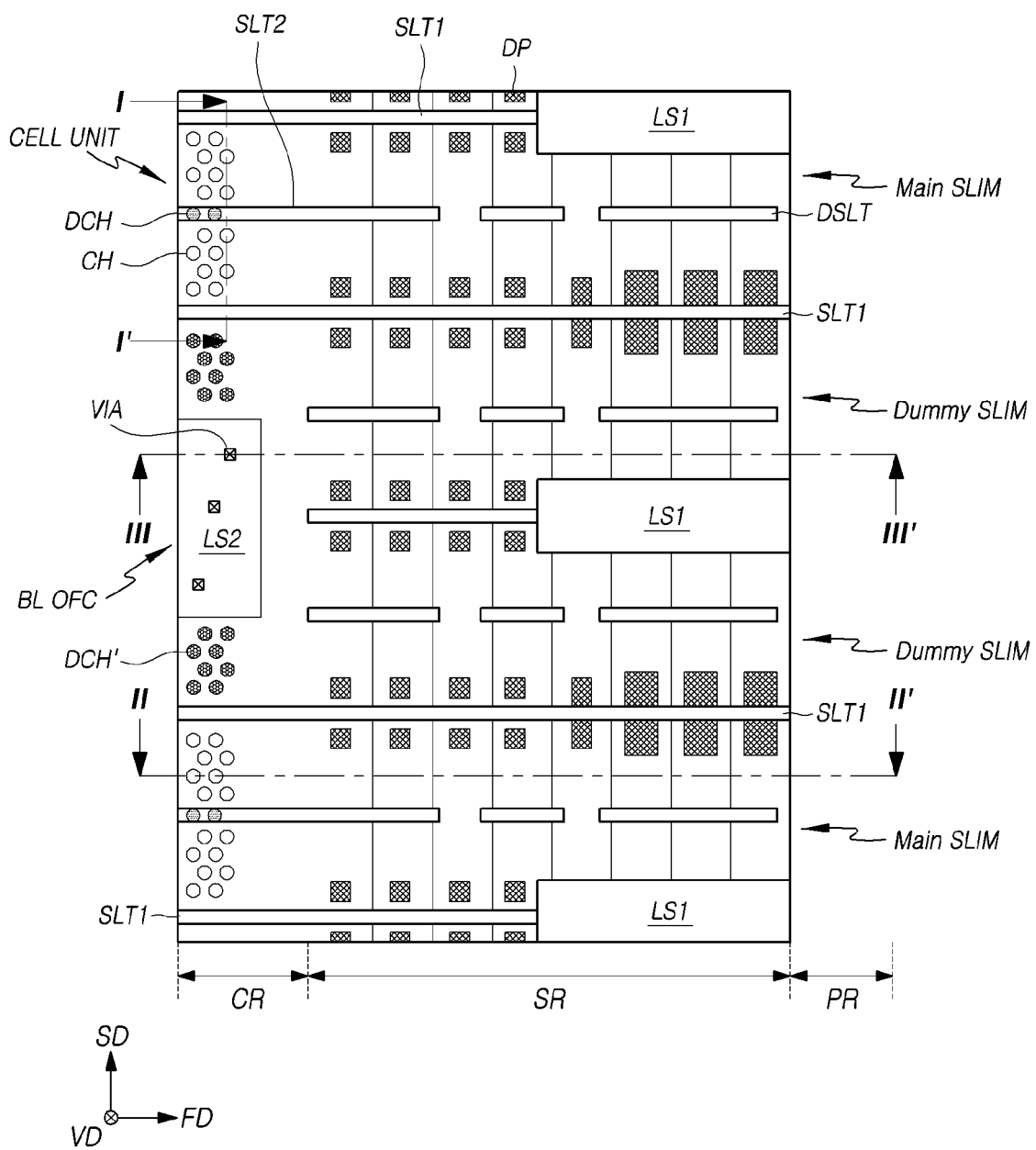
FIG. 6 is a top view illustrating a part of a semiconductor memory device in accordance with an embodiment of the disclosure.
Figure 7A:
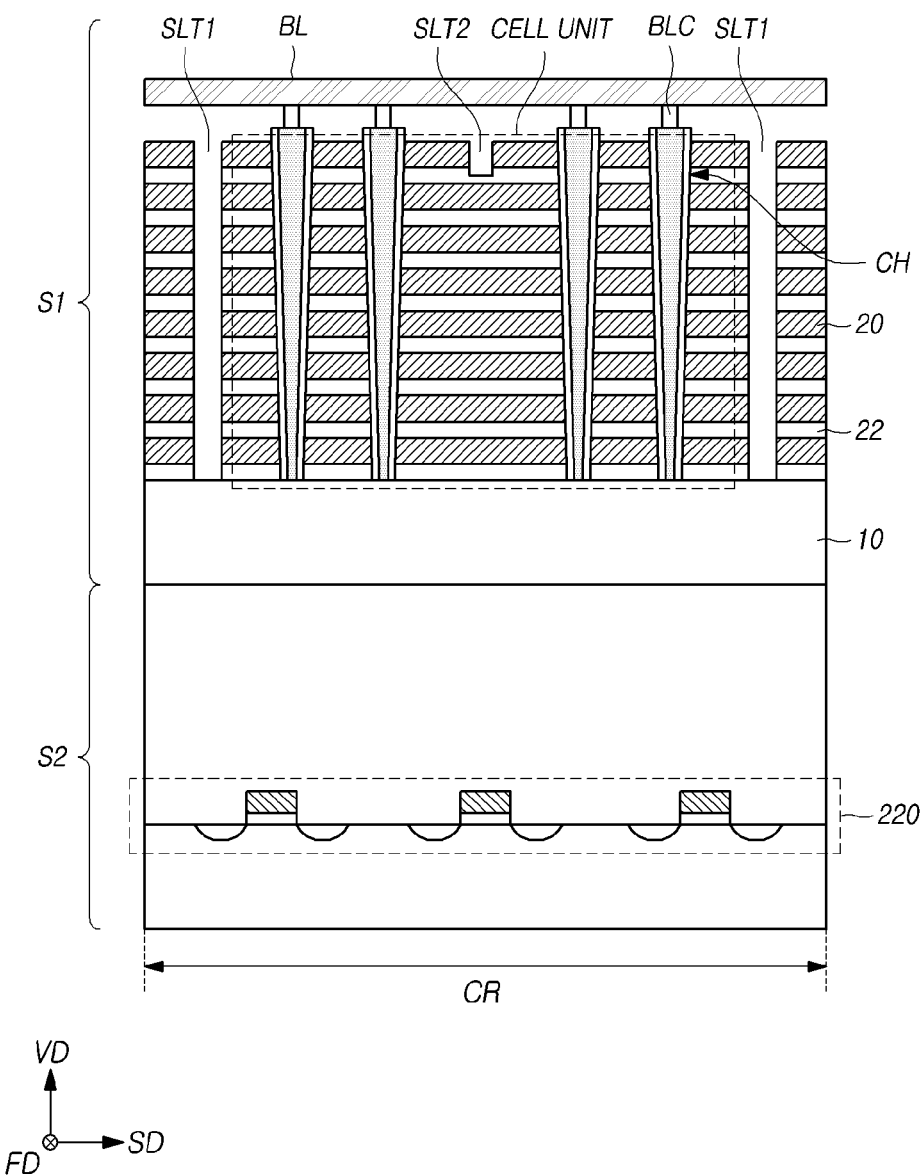
FIG. 7A is a sectional view taken along the line I-I' of FIG. 6.

FIG. 6 is a top view illustrating a part of a semiconductor memory device in accordance with an embodiment of the disclosure. FIGS. 7A to 7C are sectional views of the semiconductor memory device of FIG. 6. FIGS. 7A to 7C illustrate cross-sections corresponding to cut lines I-I', II-II' and III-III' of FIG. 6, respectively. For the sake of simplicity in illustration, some components such as bit lines, contacts and wiring lines are omitted in FIG. 6.

Figure 7B:
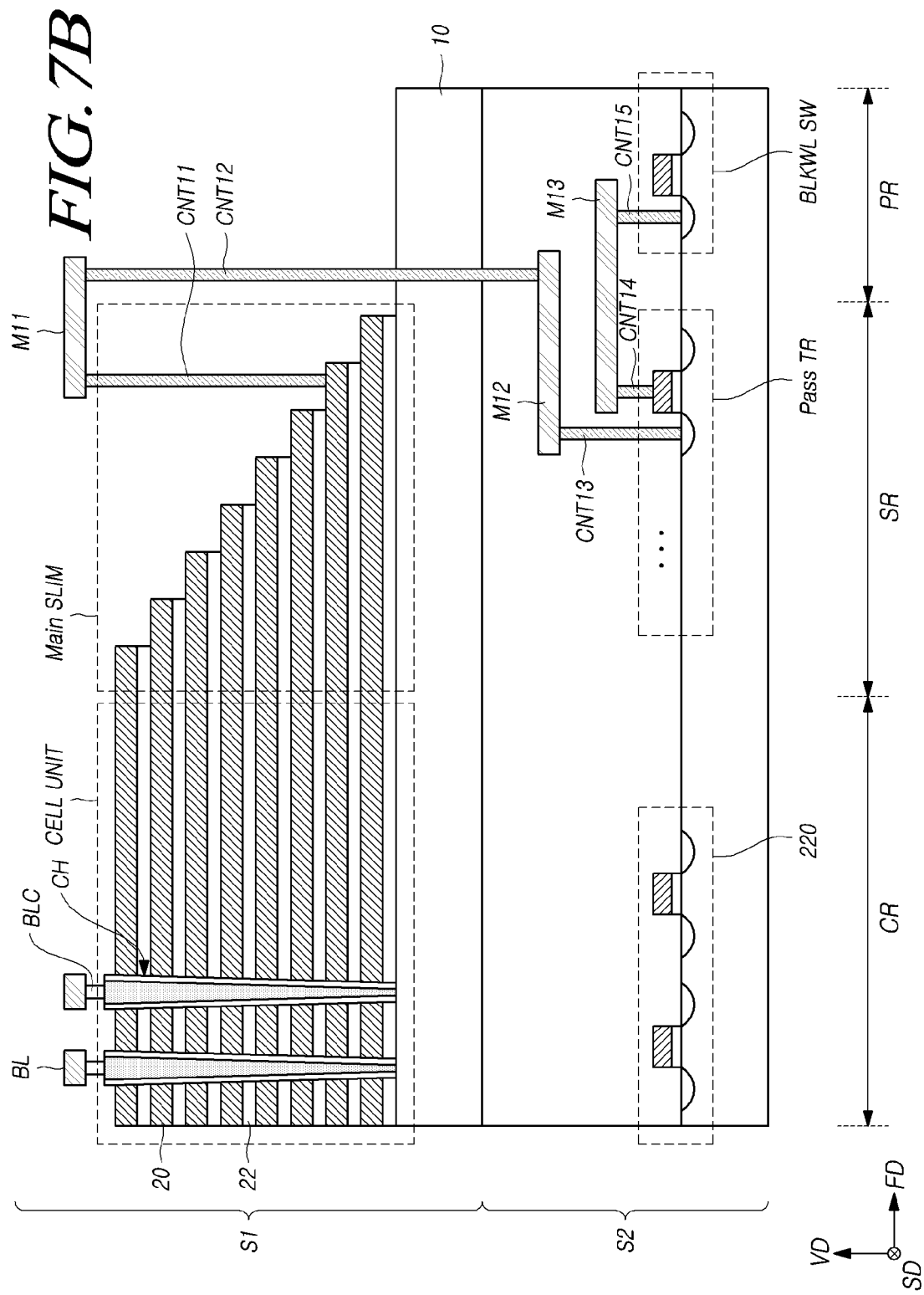
FIG. 7B is a sectional view taken along the line II-II' of FIG. 6.

Referring to FIGS. 6, 7A and 7B, a first semiconductor layer S1 may include a plurality of electrode layers 20 and a plurality of interlayer dielectric layers 22, which are alternately stacked.

The electrode layers 20 may include at least one selected from among a semiconductor (e.g., doped silicon), a metal (e.g., tungsten, copper or aluminum), a conductive metal nitride (e.g., titanium nitride or tantalum nitride) and a transition metal (e.g., titanium or tantalum). The interlayer dielectric layers 22 may include silicon oxide.

As the plurality of electrode layers 20 and the plurality of interlayer dielectric layers 22 are separated by first slits SLT1, a plurality of cell units CELL UNIT and a plurality of via regions BL OFC may be provided and arranged in the second direction SD in a cell region CR. Although FIG. 6 illustrates only one via region BL OFC, it should be understood that a plurality of via regions BL OFC are provided as described above with reference to FIG. 4.

Each of the plurality of cell units CELL UNIT may include the plurality of electrode layers 20 and the plurality of interlayer dielectric layers 22, which are alternately stacked, and a plurality of vertical channels CH, which pass through the plurality of electrode layers 20 and the plurality of interlayer dielectric layers 22 in the vertical direction VD. In addition, the cell unit CELL UNIT may further include a plurality of dummy vertical channels DCH.

The electrode layers 20 of each cell unit CELL UNIT may configure row lines RL of FIG. 1. In detail, among the electrode layers 20, at least one electrode layer 20 from the lowermost electrode layer 20 may configure a source select line, and at least one electrode layer 20 from the uppermost electrode layer 20 may configure a drain select line. The electrode layers 20 between the source select line and the drain select line may configure word lines. While FIGS. 7A and 7B illustrate eight electrode layers 20 that are stacked, this is for illustration purposes only. The number of electrode layers 20 selected may vary depending on a memory capacity.

In each cell unit CELL UNIT, the plurality of vertical channels CH and the plurality of dummy vertical channels DCH may be disposed in a plurality of channel rows that extend in the first direction FD. While FIG. 6 illustrates cell units CELL UNIT including nine channel rows, the disclosure is not limited thereto. As will be described later with reference to FIGS. 8A to 8D, the number of channel rows included in each cell unit CELL UNIT may be changed to eight, seventeen (17), or nineteen (19), and other numbers may be used in other embodiments.

The plurality of vertical channels CH may extend to a first substrate 10 by passing through the plurality of electrode layers 20 and the plurality of interlayer dielectric layers 22 in the vertical direction VD.

Each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Although not illustrated, the dummy vertical channel DCH may have the same structure as the vertical channel CH.

A source select transistor may be configured in areas or regions where the source select line surrounds the vertical channel CH. A memory cell may be configured in areas or regions where the word line surrounds the vertical channel CH. A drain select transistor may be configured in areas or regions where the drain select line surrounds the vertical channel CH. A source select transistor, a plurality of memory cells and a drain select transistor, which are disposed along one vertical channel CH, may configure one cell string.

A plurality of bit lines BL may be disposed over a stack including the plurality of electrode layers 20 and the plurality of interlayer dielectric layers 22, which are alternately stacked. Each of the bit lines BL may be coupled to a corresponding vertical channel CH through a bit line contact BLC.

Each main slim pattern Main SLIM may be configured with electrode layers 20 and interlayer dielectric layers 22 of a corresponding cell unit CELL UNIT that extend in the first direction FD from the cell region CR to the slimming region SR, and the layers may be configured to have a staircase structure. The main slim pattern Main SLIM may include various structures, for example, dummy pillars DP and dummy slits DSLT.

The plurality of electrode layers 20 and the plurality of interlayer dielectric layers 22 may be formed through processes of alternately stacking a plurality of sacrificial layers (not illustrated) and the plurality of interlayer dielectric layers 22, of partially removing the sacrificial layers by injecting an etchant through the first slits SLT1 and the dummy slits DSLT, and of filling an electrode material in spaces from which the sacrificial layers are removed.

At the process of removing the sacrificial layers, a problem may arise in that the interlayer dielectric layers 22 collapse or bend, and an interval between the interlayer dielectric layers 22 might not be maintained or may be changed. In order for reliable removal of the sacrificial layers at the process of removing the sacrificial layers, or in order to mitigate a stress, the dummy pillars DP may serve to support the interlayer dielectric layers 22 and thereby prevent the interlayer dielectric layers 22 from being deformed during the process of removing the sacrificial layers, and the dummy slits DSLT may serve as passages through which the etchant used to remove the sacrificial layers is introduced. However, roles of the dummy pillars DP and the dummy slits DSLT are not limited thereto.

The plurality of first slits SLT1 may extend in the first direction FD while passing through the plurality of electrode layers 20 and the plurality of interlayer dielectric layers 22 in the vertical direction VD. Each cell unit CELL UNIT may be separated from another adjacent cell unit CELL UNIT or from an adjacent via region BL OFC by the first slit SLT1.

A second slit SLT2, which extends in the first direction FD, may be formed to divide at least one electrode layer, positioned at an upper part from among the electrode layers 20 included in each cell unit CELL UNIT, into a plurality of electrode layers 20. The electrode layers 20 which are divided or segmented by the second slit STL2 may configure drain select lines. A plurality of first dielectric stacks LS1 may be configured in the slimming region SR. Each of the first dielectric stacks LS1 may have a structure in which a plurality of dielectric layers and the plurality of interlayer dielectric layers 22 are alternately stacked. The dielectric layers of the first dielectric stacks LS1 correspond to sacrificial layers that are not removed and are maintained in the process of removing the sacrificial layers by injecting the etchant through the first slits SLT1 and the dummy slits DSLT.

A contact CNT11 may be coupled to each of the electrode layers 20 of the main slim pattern Main SLIM. Each of the electrode layers 20 may be coupled to a pass transistor group Pass TR through wiring lines M11 and M12 and contacts CNT12 and CNT13 coupled to the contact CNT11. For the sake of simplicity in illustration, FIG. 7B illustrates only the wiring lines M11 and M12 and the contacts CNT11 to CNT13, which couple one electrode layer 20 and the pass transistor group Pass TR, but it should be understood that wiring lines and contacts, which individually couple each of the electrode layers 20 to the pass transistor group Pass TR, are provided.

The pass transistor group Pass TR may include a plurality of pass transistors on a second substrate 12. Each of the pass transistors may be coupled to a corresponding electrode layer 20 through contacts CNT11 to CNT13 and wiring lines M11 and M12, and thereby, may transfer operating voltages to the electrode layer 20. A pass transistor included in the pass transistor group Pass TR may be coupled to a corresponding block selection unit BLKWL SW through contacts CNT14 and CNT15 and a wiring line M13, and thereby, may be provided with a block select signal from the block selection unit BLKWL SW. The pass transistor may transfer the operating voltages to the corresponding electrode layer 20 in response to the block select signal.

Referring to FIGS. 6 and 7C, the via region BL OFC may include a plurality of electrode layers 20 and a plurality of interlayer dielectric layers 22, which are alternately stacked on the cell region CR of the first substrate 10, a plurality of dummy channels DCH' that pass through the plurality of electrode layers 20 and the plurality of interlayer dielectric layers 22, and a second dielectric stack LS2. The second dielectric stack LS2 may have a structure in which a plurality of dielectric layers 24 and the plurality of interlayer dielectric layers 22 are alternately stacked. The dielectric layers 24 may be configured by a dielectric material that has a different etching selectivity from the interlayer dielectric layers 22. For example, if the interlayer dielectric layers 22 are configured by silicon oxide, then the dielectric layers 24 may be configured by nitride. The second dielectric stack LS2 may be formed through the same processes used to form the first dielectric stack LS1 as described above. Namely, the dielectric layers 24 of the second dielectric stack LS2 correspond to sacrificial layers that are not removed and remain during the process of removing the sacrificial layers by injecting the etchant through the first slits SLT1 and the dummy slits DSLT.

A via VIA may be positioned in the second dielectric stack LS2 of the via region BL OFC. The via VIA may be coupled to the bit line BL and may pass vertically through the second dielectric stack LS2 into the second semiconductor layer S2 to be coupled to a wiring line M21. The via VIA may be coupled to the page buffer circuit 220 through a contact CNT21, which is coupled to the wiring line M21.

The dummy slim pattern Dummy SLIM may be fabricated using the same design as the main slim pattern Main SLIM. For example, the dummy slim pattern Dummy SLIM may have substantially the same structure as the main slim pattern Main SLIM, or may have a structure symmetrical to the main slim pattern Main SLIM based on a virtual line extending in the first direction FD. If the main slim pattern Main SLIM has a staircase structure and is configured to include dummy pillars DP, dummy slits DSLT and a first dielectric stack LS1, then the dummy slim pattern Dummy SLIM may also have a staircase structure and be configured to include dummy pillars DP, dummy slits DSLT and a first dielectric stack LS1.

A conductive pattern such as a contact may not be formed on the dummy slim pattern Dummy SLIM. Alternatively, a dummy conductive pattern that is not used for electrical coupling may be formed on the dummy slim pattern Dummy SLIM.

As described above with reference to FIG. 4, the width of one via region BL OFC in the second direction SD has a size corresponding to a multiple of the width of one cell unit CELL UNIT in the second direction SD. Therefore, it is also possible to configure a width of one dummy slim pattern Dummy SLIM in the second direction SD to have the same size as the width of the main slim pattern Main SLIM in the second direction SD.

Unlike the present embodiment, in a case where the width of one via region BL OFC in the second direction SD is not a multiple of the width of one cell unit CELL UNIT in the second direction SD, the width of at least one of the dummy slim patterns Dummy SLIM in the second direction SD will have a size different from the width of the main slim pattern Main SLIM in the second direction SD.

The structures included in the main slim patterns Main SLIM and the dummy slim patterns Dummy SLIM, such as for example, the dummy pillars DP, the dummy slits DSLT and the first dielectric stacks LS1, are designed to perform target functions. Therefore, if a size of either pattern is changed, then a pattern design needs to be changed according to the changed size.

If there is a dummy slim pattern Dummy SLIM whose width in the second direction SD has a size different from the width of the main slim pattern Main SLIM in the second direction SD, then the corresponding dummy slim pattern Dummy SLIM needs to be separately designed, and thus, a lot of effort and time will be required for the development of a design.

According to embodiments of the disclosure, by configuring the width of one via region BL OFC in the second direction SD to have a size corresponding to a multiple of the width of one cell unit CELL UNIT in the second direction SD, the width of the dummy slim pattern Dummy SLIM in the second direction SD may be configured to have the same size as the width of the main slim pattern Main SLIM in the second direction SD, and accordingly, the dummy slim patterns Dummy SLIM may be fabricated using the same design as the main slim pattern Main SLIM. Consequently, effort and time consumed for the development of a different design for either pattern may be reduced.

FIGS. 8A to 8D are top views illustrating various examples of cell units in accordance with embodiments of the disclosure.

Figure 8A:
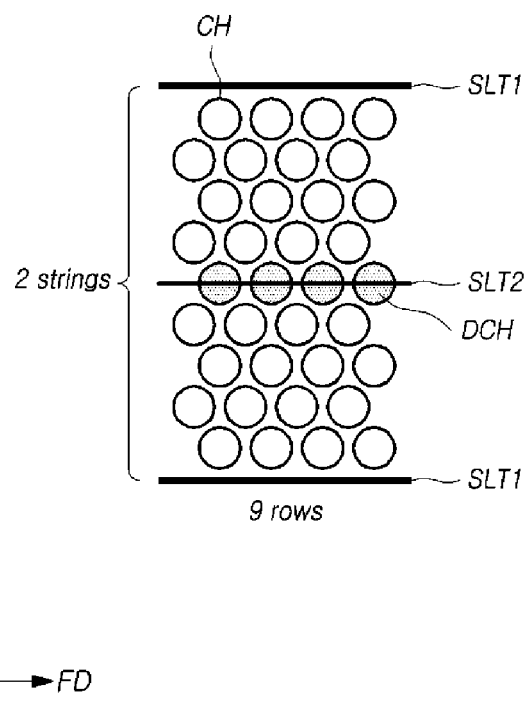
FIGS. 8A to 8D are top views illustrating various examples of cell units in accordance with embodiments of the disclosure.

Referring to FIG. 8A, a cell unit may include a plurality of channel rows. FIG. 8A illustrates an embodiment with nine channel rows (9 rows), extending in the first direction FD and arranged in the second direction SD, are included in one cell unit between two first slits SLT1. In order to provide a compact layout, odd-numbered channel rows and even-numbered channel rows may be disposed to be offset from each other in the first direction FD.

A second slit SLT2 may divide, into two, an electrode layer that is used to configure a drain select line from among the electrode layers included in the cell unit. For example, two drain select lines may be provided in one cell unit illustrated in FIG. 8A, and this structure may be defined as a two-string structure.

In the present embodiment, the second slit SLT2 may be configured to traverse a fifth channel row from among the nine channel rows. Dummy vertical channels DCH may be configured in the fifth channel row, which the second slit SLT2 traverses, while vertical channels CH may be configured in the other channel rows.

Figure 8B:
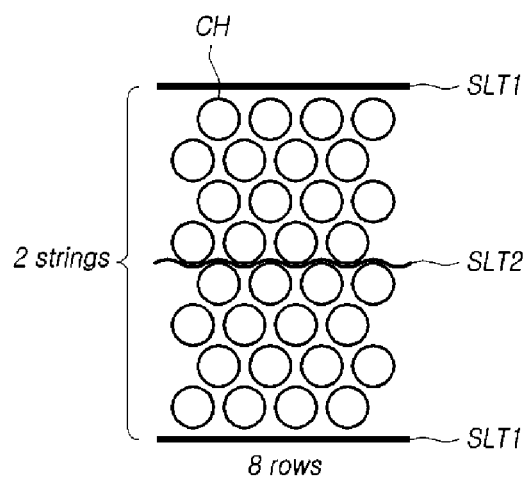
Figure 8B:
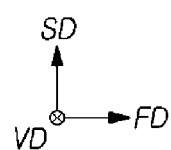

Referring to FIG. 8B, in an embodiment, a second slit SLT2 may be formed to undulate along the outer edges or sidewalls of vertical channels CH disposed in two adjacent and offset channel rows. That is to say, the second slit SLT2 may be configured in a wave-like shape extending in the first direction FD between the vertical channels CH. In this case, since the second slit SLT2 does not traverse a channel row, dummy vertical channels are not configured in the one cell unit. Therefore, it is possible to realize a memory capacity that is same as that of a structure including nine channel rows (9 rows) while using only eight channel rows (8 rows).

Figure 8C:
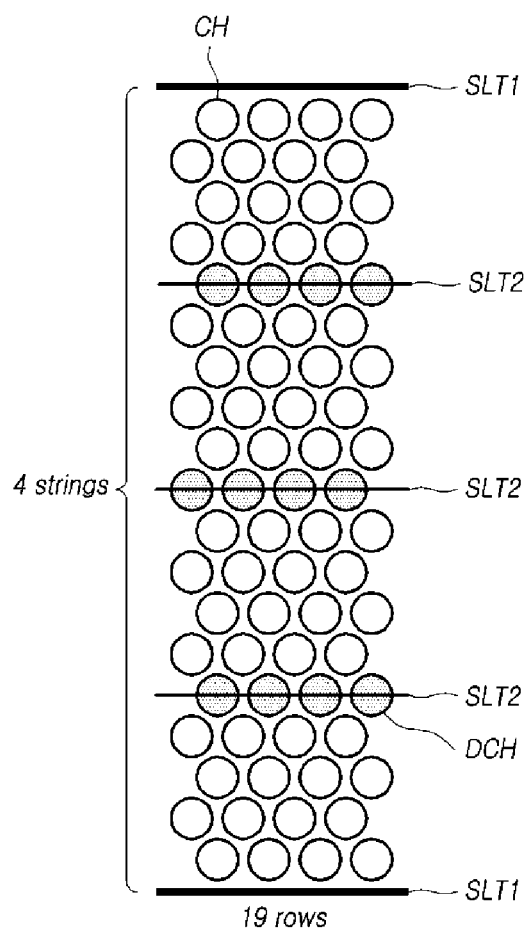

Referring to FIG. 8C, in an embodiment, one cell unit may include 19 channel rows (19 rows) and three second slits SLT2. In this case, an electrode layer that is used to configure a drain select line is divided into four by the second slits SLT2, which provides four drain select lines in one cell unit. This structure may be defined as a four-string structure.

Among the 19 channel rows, dummy vertical channels DCH may be configured in fifth, tenth and fifteenth channel rows, which the second slits SLT2 traverse. Vertical channels CH may be configured in the other channel rows.

Figure 8D:
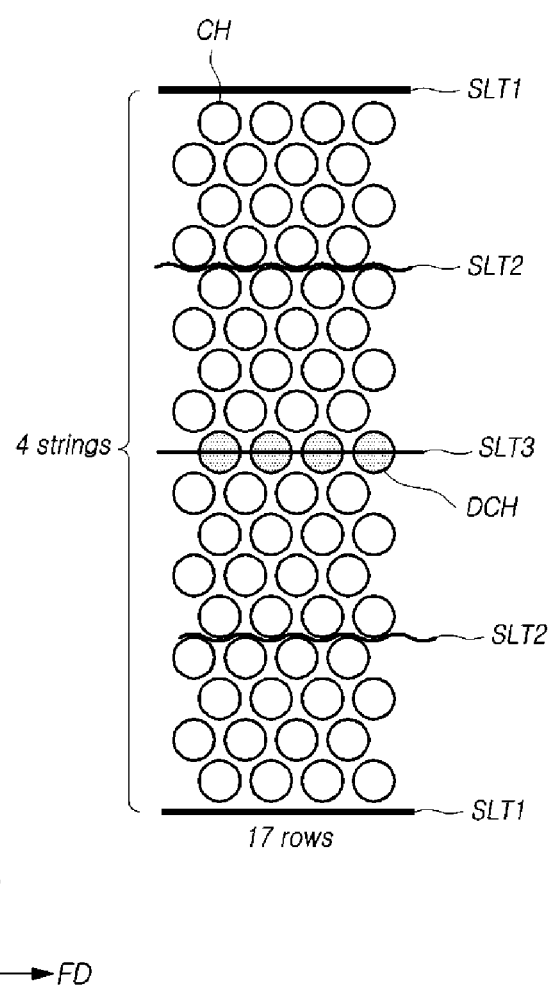

Referring to FIG. 8D, in an embodiment, one cell unit may include 17 channel rows (17 rows), two second slits SLT2, and one third slit SLT3.

The second slits SLT2 may divide an electrode layer that is used to configure a drain select line, from among electrode layers included in the cell unit, and may be configured in a wave-like shape between vertical channels CH. For example, one of the second slits SLT2 may be disposed between a fourth channel row and a fifth channel row, and the other of the second slits SLT2 may be disposed between a thirteenth channel row and a fourteenth channel row.

The third slit SLT3 may divide an electrode layer that is used to configure a source select line from among the electrode layers included in the cell unit. As a result, two source select lines may be provided in one cell unit. The third slit SLT3 may be configured to traverse a ninth channel row among the 17 channel rows in the first direction FD. Dummy vertical channels DCH may be configured in the ninth channel row, which the third slit SLT3 traverses, and vertical channels CH may be configured in the other channel rows.

Because the second slits SLT2 do not traverse the channel rows, it is possible to realize a memory capacity that is the same as that of a structure including 19 channel rows (19 rows) by using only 17 channel rows (17 rows).

Figure 9A:
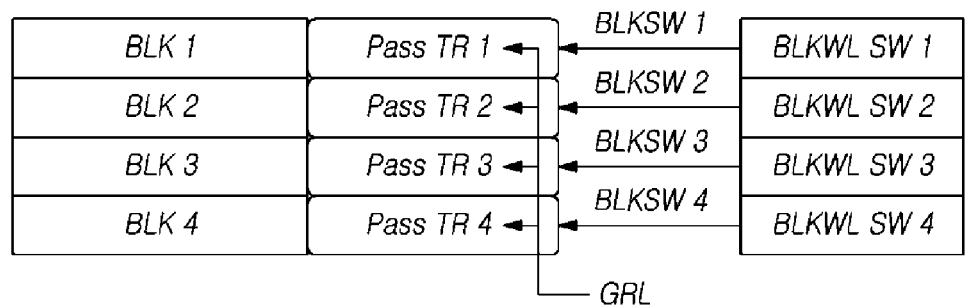
FIGS. 9A to 9C are block diagrams illustrating various examples of block selection units in accordance with embodiments of the disclosure.
Figure 9A:
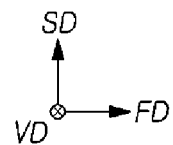
Figure 9B:
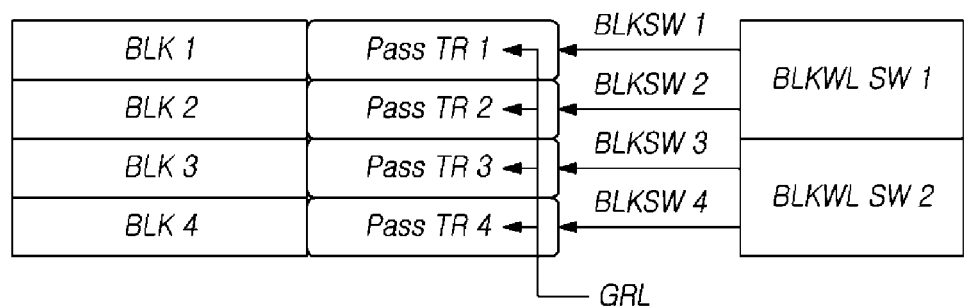
Figure 9B:
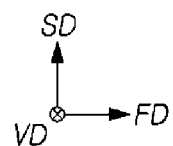
Figure 9C:
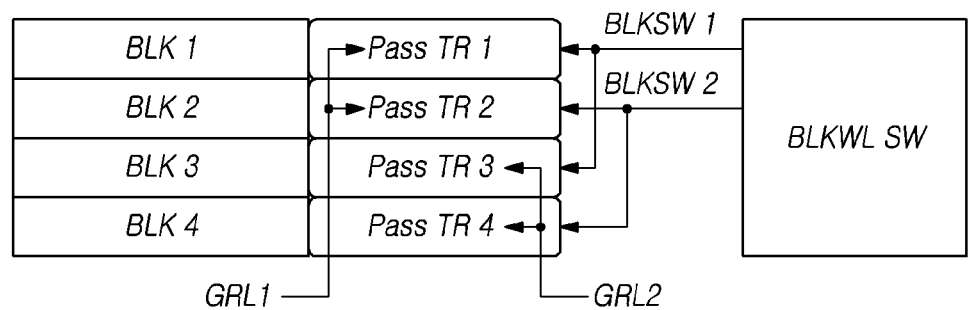
Figure 9C:
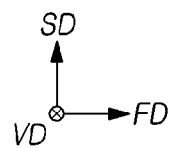

FIGS. 9A to 9C are block diagrams illustrating various examples of block selection units in accordance with embodiments of the disclosure. FIGS. 9A to 9C illustrate structures corresponding to four memory blocks BLK 1 to BLK 4.

Referring to FIG. 9A, four pass transistor groups Pass TR 1 to Pass TR 4 corresponding to four memory blocks BLK 1 to BLK 4, respectively, may be provided.

A plurality of global row lines GRL may be coupled in common to the pass transistor groups Pass TR 1 to Pass TR 4, and thus, the pass transistor groups Pass TR 1 to Pass TR 4 may share the plurality of global row lines GRL.

Four block selection units BLKWL SW 1 to BLKWL SW 4 corresponding to the four pass transistor groups Pass TR 1 to Pass TR 4, respectively, may be provided. A width of each of the block selection units BLKWL SW 1 to BLKWL SW 4 in the second direction SD may be substantially the same as a width of one pass transistor group (one of Pass TR 1 to Pass TR 4) in the second direction SD.

Each of the block selection units BLKWL SW 1 to BLKWL SW 4 may provide a block select signal (one of BLKSW 1 to BLKSW 4) to a corresponding one pass transistor group (one of Pass TR 1 to Pass TR 4). For example, the first block selection unit BLKWL SW 1 may provide the block select signal BLKSW 1 to the first pass transistor group Pass TR 1.

Any one of the block select signals BLKSW 1 to BLKSW 4 may be activated. A pass transistor group provided with the activated block select signal may transfer operating voltages applied to the global row lines GRL to a corresponding memory block.

Referring to FIG. 9B, two block selection units BLKWL SW 1 and BLKWL SW 2 may be provided in correspondence to four pass transistor groups Pass TR 1 to Pass TR 4. In an example, a width of each of the block selection units BLKWL SW 1 and BLKWL SW 2 in the second direction SD may have a size corresponding to twice the width of one pass transistor group (one of Pass TR 1 to Pass TR 4) in the second direction SD, or a width of each of the block selection units BLKWL SW 1 and BLKWL SW 2 in the second direction SD may have a size corresponding to a pair of pass transistor groups in the second direction SD.

Each of the block selection units BLKWL SW 1 and BLKWL SW 2 may correspond in common to two pass transistor groups, and may provide different block select signals to the corresponding two pass transistor groups. For example, the first block selection unit BLKWL SW 1 may correspond in common to the first pass transistor group Pass TR 1 and the second pass transistor group Pass TR 2. The first block selection unit BLKWL SW 1 may provide a first block select signal BLKSW 1 to the first pass transistor group Pass TR 1 and may provide a second block select signal BLKSW 2 to the second pass transistor group Pass TR 2.

Any one of block select signals BLKSW 1 to BLKSW 4 may be activated, and a pass transistor group provided with the activated block select signal may transfer operating voltages applied to global row lines GRL to a corresponding memory block.

Referring to FIG. 9C, first and second pass transistor groups Pass TR 1 and Pass TR 2 and third and fourth pass transistor groups Pass TR 3 and Pass TR 4 may be coupled to different global row lines. For example, the first pass transistor group Pass TR 1 and the second pass transistor group Pass TR 2 may be coupled to a plurality of first global row lines GRL1, and the third pass transistor group Pass TR 3 and the fourth pass transistor group Pass TR 4 may be coupled to a plurality of second global row lines GRL2.

One block selection unit BLKWL SW may be provided in correspondence to the four pass transistor groups Pass TR 1 to Pass TR 4. A width of the block selection unit BLKWL SW in the second direction SD may have a size corresponding to four times a width of one pass transistor group in the second direction SD, or corresponding to the width of the four pass transistor groups Pass TR 1 to Pass TR 4 in the second direction SD.

The block selection unit BLKWL SW may provide one block select signal to two pass transistor groups that are coupled to different global row lines. For example, the block selection unit BLKWL SW may provide a first block select signal BLKSW 1 to the first pass transistor group Pass TR 1, which is coupled to the first global row lines GRL1, and to the third pass transistor group Pass TR 3, which is coupled to the second global row lines GRL2. In addition, the block selection unit BLKWL SW may provide a second block select signal BLKSW 2 to the second pass transistor group Pass TR 2, which is coupled to the first global row lines GRL1, and to the fourth pass transistor group Pass TR 4, which is coupled to the second global row lines GRL2. This structure may be defined as a shared decoder structure.

In the shared decoder structure, two pass transistor groups that share one block select signal may be coupled to different global row lines, and operating voltages may be applied to only the global row lines that are coupled to any one of the two pass transistor groups. Thus, the operating voltages may be provided to one of two memory blocks that share the block select signal.

Figure 10A:
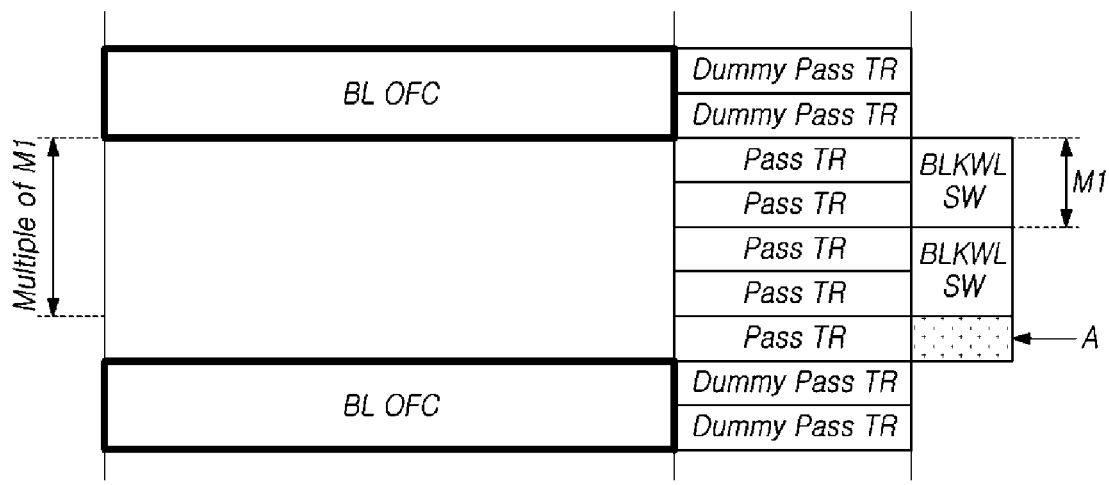
FIGS. 10A and 10B are exemplary top views illustrating semiconductor memory devices that are different from the disclosure.
Figure 10A:
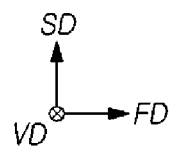
Figure 10B:
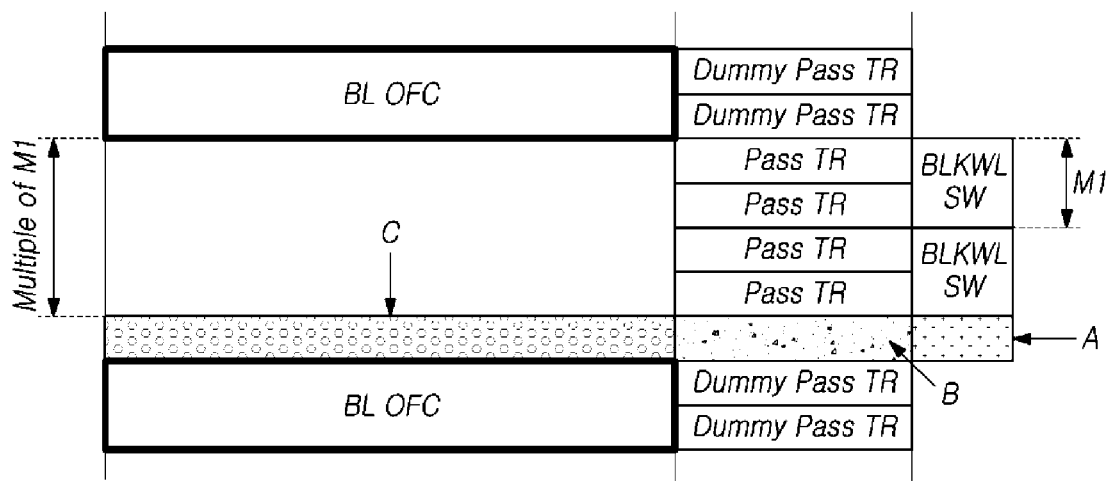
Figure 10B:
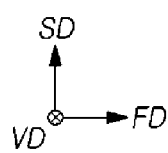

FIGS. 10A and 10B are exemplary top views illustrating semiconductor memory devices that are different from the disclosure.

FIGS. 10A and 10B illustrate a case where an interval between adjacent via regions BL OFC is not a multiple of a width M1 of a block selection unit BLKWL SW in the second direction SD.

Referring to FIG. 10A, when the interval between adjacent via regions BL OFC is not a multiple of M1, a block selection unit having a width in the second direction SD that is smaller than M1 will be formed as illustrated by area A. M1 denotes a width, in the second direction SD, of a standard block selection unit BLKWL SW that meets a predetermined standard.

Due to a difference in width in the second direction SD, it is impossible to configure the block selection unit A having the same layout as the standard block selection unit BLKWL SW. As a consequence, due to a change in layout, it is difficult to secure device characteristics, which causes degradation in performance.

Referring to FIG. 10B, in the case where a block selection unit A and a pass transistor group B and a cell unit C associated therewith are not used and are processed as dummies, a problem of performance degradation due to the block selection unit A will not be caused. However, a larger area is required to realize a memory with a desired capacity due to an additional area consumed by the presence of the dummy cell unit C. That is, a size of the semiconductor memory device will increase.

According to embodiments of the disclosure, by configuring an interval between adjacent via regions BL OFC to a size corresponding to a multiple of M1, it is possible to prevent a block selection unit whose width in the second direction SD is smaller than M1, from being formed. Thus, it is possible to prevent performance from being degraded due to a layout change and a corresponding change in device characteristics. In addition, it is possible to prevent a dummy cell unit from being formed, thereby contributing to miniaturization of a semiconductor memory device.

Figure 11:
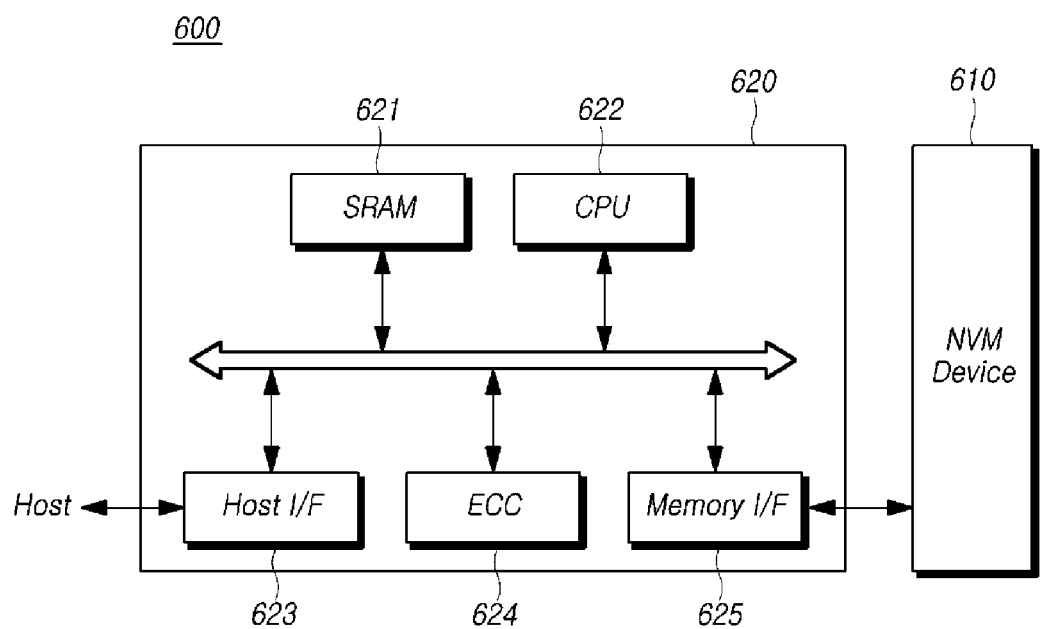
FIG. 11 is a block diagram schematically illustrating a memory system including a semiconductor memory device in accordance with an embodiment of the disclosure.

FIG. 11 is a block diagram schematically illustrating a memory system including a semiconductor memory device in accordance with an embodiment of the disclosure.

Referring to FIG. 11, a memory system 600 in accordance with an embodiment may include a nonvolatile memory device (NVM Device) 610 and a memory controller 620.

The nonvolatile memory device (NVM Device) 610 may be constituted by a semiconductor memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 12:
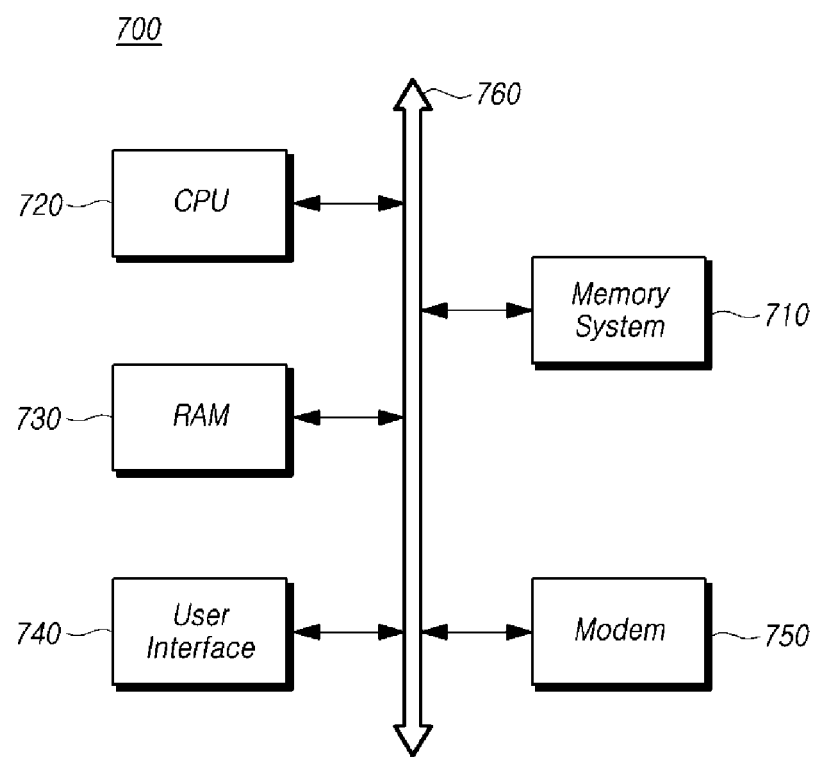
FIG. 12 is a block diagram schematically illustrating a computing system including a semiconductor memory device in accordance with an embodiment of the disclosure.

FIG. 12 is a block diagram schematically illustrating a computing system including a semiconductor memory device in accordance with an embodiment of the disclosure.

Referring to FIG. 12, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor memory device comprising:
a memory cell array, disposed over a substrate extending in a first direction and a second direction intersecting with the first direction in a first semiconductor layer, that includes a plurality of cell units and at least two via regions arranged in the second direction,
wherein a width of each of the at least two via regions in the second direction is a multiple of a width of each of the plurality of cell units in the second direction,
wherein each of the plurality of cell units comprises a plurality of electrode layers and a plurality of interlayer dielectric layers that are alternately stacked and comprises a plurality of vertical channels that pass through the plurality of electrode layers and the plurality of interlayer dielectric layers in a vertical direction, and
wherein the first semiconductor layer further comprises a plurality of first slits extend in the first direction and pass through the plurality of electrode layers and the plurality of interlayer dielectric layers in the vertical direction to define and separate the plurality of cell units and the at least two via regions.

2. The semiconductor memory device according to claim 1,
wherein the first semiconductor layer further comprises:
a plurality of main slim patterns coupled to the plurality of cell units, respectively, with each of the plurality of main slim patterns extending in the first direction from a corresponding cell unit; and
a plurality of dummy slim patterns coupled to each of the at least two via regions,
wherein the plurality of main slim patterns and the plurality of dummy slim patterns are arranged in the second direction, and
wherein a width of each of the plurality of main slim patterns and each of the plurality of dummy slim patterns in the second direction is the same as the width of each of the plurality of cell units in the second direction.

3. The semiconductor memory device according to claim 2,
wherein each of the plurality of main slim patterns is configured by the plurality of electrode layers and the plurality of interlayer dielectric layers that extend in the first direction from the plurality of cell units.

4. The semiconductor memory device according to claim 3,
wherein each of the plurality of cell units includes a plurality of channel rows, extending in the first direction and arranged in the second direction, that pass through the plurality of electrode layers and the plurality of interlayer dielectric layers in the vertical direction, and
wherein channel rows in the plurality of channel rows of each of the plurality of cell units are offset from each other in the first direction.

5. The semiconductor memory device according to claim 4,
wherein a second slit extending in the first direction divides at least one upper layer of the plurality of electrode layers, and
wherein, in the second slit, a plurality of dummy vertical channels are arranged in the first direction and pass through the plurality of electrode layers and the plurality of interlayer dielectric layers in the vertical direction.

6. The semiconductor memory device according to claim 4,
wherein a second slit extending in the first direction divides at least one upper layer of the plurality of electrode layers, and
wherein the second slit has a wave-like shape that undulates between two adjacent offset channel rows among the plurality of channel rows.

7. The semiconductor memory device according to claim 2, wherein each of the plurality of dummy slim patterns has the same structure as one of the plurality of main slim patterns, or has a structure symmetrical to one of the plurality of main slim patterns based on a virtual line extending in the first direction.

8. The semiconductor memory device according to claim 2, further comprising:
a second semiconductor layer arranged in the vertical direction from the first semiconductor layer,
wherein the second semiconductor layer comprises:
a plurality of pass transistor groups disposed to overlap with the plurality of main slim patterns in the vertical direction; and
a plurality of dummy pass transistor groups disposed to overlap with the plurality of dummy slim patterns in the vertical direction,
wherein the plurality of pass transistor groups and the plurality of dummy pass transistor groups are arranged in the second direction, and
wherein a width of each of the plurality of dummy pass transistor groups in the second direction is the same as a width of each of the plurality of pass transistor groups in the second direction.

9. The semiconductor memory device according to claim 1, further comprising:
a second semiconductor layer arranged in the vertical direction from the first semiconductor layer,
wherein the second semiconductor layer comprises a page buffer circuit including a plurality of page buffer high-voltage regions that are disposed with an interval in the second direction between two adjacent page buffer high-voltage regions,
wherein the number of the at least two via regions is the same as the number of the plurality of page buffer high-voltage regions.

10. The semiconductor memory device according to claim 9,
wherein the at least two via regions correspond respectively to the plurality of page buffer high-voltage regions-, and a page buffer high-voltage region and a corresponding via region overlap with each other in the vertical direction.

11. A semiconductor memory device comprising:
a memory cell array, disposed over a substrate extending in a first direction and a second direction intersecting with the first direction in a first semiconductor layer, that includes a plurality of cell units and at least two via regions arranged in the second direction; and
a plurality of block selection units, included in a second semiconductor layer arranged in a vertical direction from the first semiconductor layer, that are arranged in the second direction, wherein an interval between adjacent via regions corresponds to a multiple of a width of each of the plurality of block selection units in the second direction, wherein each of the plurality of cell units comprises a plurality of electrode layers and a plurality of interlayer dielectric layers that are alternately stacked and comprises a plurality of vertical channels that pass through the plurality of electrode layers and the plurality of interlayer dielectric layers in the vertical direction, and wherein the first semiconductor layer further comprises a plurality of first slits extend in the first direction and pass through the plurality of electrode layers and the plurality of interlayer dielectric layers in the vertical direction to define and separate the plurality of cell units and the at least two via regions.

12. The semiconductor memory device according to claim 11, wherein a width of each of the at least two via regions in the second direction is a multiple of a width of each of the plurality of cell units in the second direction.

13. The semiconductor memory device according to claim 12, wherein the first semiconductor layer further comprises:

a plurality of main slim patterns coupled to the plurality of cell units, respectively, with each of the plurality of main slim patterns extending in the first direction from a corresponding cell unit; and a plurality of dummy slim patterns coupled to each of the at least two via regions, wherein the plurality of main slim patterns and the plurality of dummy slim patterns are arranged in the second direction, and wherein a width of each of the plurality of main slim patterns and each of the plurality of dummy slim patterns in the second direction is the same as the width of each of the plurality of cell units in the second direction.

14. The semiconductor memory device according to claim 13, wherein each of the plurality of main slim patterns is configured by the plurality of electrode layers and the plurality of interlayer dielectric layers that extend in the first direction from the plurality of cell units.

15. The semiconductor memory device according to claim 14, wherein each of the plurality of cell units includes a plurality of channel rows, extending in the first direction and arranged in the second direction, that pass through the plurality of electrode layers and the plurality of interlayer dielectric layers in the vertical direction, and wherein channel rows in the plurality of channel rows of each of the plurality of cell units are offset from each other in the first direction.

16. The semiconductor memory device according to claim 15, wherein a second slit extending in the first direction divides at least one upper layer of the plurality of electrode layers, and wherein, in the second slit, a plurality of dummy vertical channels are arranged in the first direction and pass through the plurality of electrode layers and the plurality of interlayer dielectric layers in the vertical direction.

17. The semiconductor memory device according to claim 15, wherein a second slit extending in the first direction divides at least one upper layer of the plurality of electrode layers, and wherein the second slit has a wave-like shape that undulates between two adjacent offset channel rows among the plurality of channel rows.

18. The semiconductor memory device according to claim 13, wherein each of the plurality of dummy slim patterns has the same structure as one of the plurality of main slim patterns, or has a structure symmetrical to one of the plurality of the main slim patterns based on a virtual line extending in the first direction.

19. The semiconductor memory device according to claim 13, wherein the second semiconductor layer further includes:

a plurality of pass transistor groups disposed to overlap with the plurality of main slim patterns in the vertical direction; and a plurality of dummy pass transistor groups disposed to overlap with the plurality of dummy slim patterns in the vertical direction, wherein the plurality of pass transistor groups and the plurality of dummy pass transistor groups are arranged in the second direction, and wherein a width of each of the plurality of dummy pass transistor groups in the second direction is the same as a width of each of the plurality of pass transistor groups in the second direction.

20. The semiconductor memory device according to claim 11, wherein the second semiconductor layer further includes a page buffer circuit that includes a plurality of page buffer high-voltage regions that are disposed with an interval in the second direction between two adjacent page buffer high-voltage regions, and wherein the number of the at least two via regions is the same number as the number of the plurality of page buffer high-voltage regions.

* * * * *